United States Patent
Xu et al.

(10) Patent No.: US 10,757,848 B2
(45) Date of Patent: Aug. 25, 2020

(54) DISPLAY DEVICE AND MANUFACTURING METHOD THEREOF

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Jingyi Xu, Beijing (CN); Xin Li, Beijing (CN); Kunpeng Zhang, Beijing (CN); Yi Fan, Beijing (CN); Yanwei Ren, Beijing (CN); Yanyan Zhao, Beijing (CN); Yu Liu, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 478 days.

(21) Appl. No.: 15/569,574

(22) PCT Filed: May 16, 2017

(86) PCT No.: PCT/CN2017/084550
§ 371 (c)(1),
(2) Date: Oct. 26, 2017

(87) PCT Pub. No.: WO2017/198146
PCT Pub. Date: Nov. 23, 2017

(65) Prior Publication Data
US 2018/0228064 A1    Aug. 9, 2018

(30) Foreign Application Priority Data
May 18, 2016    (CN) .......................... 2016 1 0331525

(51) Int. Cl.
*H05K 9/00* (2006.01)
*H05F 1/02* (2006.01)
(Continued)

(52) U.S. Cl.
CPC ..... *H05K 9/0067* (2013.01); *G02F 1/136204* (2013.01); *H05F 1/02* (2013.01);
(Continued)

(58) Field of Classification Search
CPC .. G02F 1/13452; G02F 1/136204; H05F 1/02; H05F 3/04; H05K 5/0017; H05K 9/0067
(Continued)

(56) References Cited

U.S. PATENT DOCUMENTS

2005/0122042 A1    6/2005    Kang et al.
2007/0292666 A1    12/2007    Higashino
(Continued)

FOREIGN PATENT DOCUMENTS

CN    1099546 A    3/1995
CN    101087490 A    12/2007
(Continued)

OTHER PUBLICATIONS

The First Chinese Office Action dated Apr. 5, 2017; Appln. 201610331525.2.
(Continued)

*Primary Examiner* — Kevin J Comber

(57) ABSTRACT

A display device and a method for manufacturing the display device are disclosed. An edge region of the display panel of the display device includes a first region in which an exposed connection line pattern is provided and a second region in which no connection line pattern is provided, and an electrostatic layer is attached to the edge region; wherein the electrostatic shielding layer comprises an insulating material region and a conductive material region, the insu-
(Continued)

lating material region contacting the first region and the conductive material region contacting the second region.

17 Claims, 3 Drawing Sheets

(51) Int. Cl.
    *G02F 1/1362*     (2006.01)
    *H05F 3/04*     (2006.01)
    *H05K 5/00*     (2006.01)
    *G02F 1/1345*     (2006.01)

(52) U.S. Cl.
    CPC .............. *H05F 3/04* (2013.01); *H05K 5/0017* (2013.01); *G02F 1/13452* (2013.01)

(58) Field of Classification Search
    USPC ........................................................ 361/220
    See application file for complete search history.

(56) References Cited

U.S. PATENT DOCUMENTS

| | | |
|---|---|---|
| 2008/0062373 A1 | 3/2008 | Kim et al. |
| 2015/0331270 A1 | 11/2015 | Yokogawa |
| 2015/0333020 A1 | 11/2015 | Fang et al. |

FOREIGN PATENT DOCUMENTS

| | | |
|---|---|---|
| CN | 102830550 A | 12/2012 |
| CN | 103631458 A | 3/2014 |
| CN | 103809318 A | 5/2014 |
| CN | 203616554 U | 5/2014 |
| CN | 203811938 A | 9/2014 |
| CN | 105139775 A | 12/2015 |
| CN | 105848394 A | 8/2016 |
| EP | 0589519 A2 | 3/1994 |

OTHER PUBLICATIONS

International Search Report and Written Opinion dated Aug. 17, 2017; PCT/CN2017/084550.

DISPLAY DEVICE AND MANUFACTURING METHOD THEREOF

TECHNICAL FIELD

Embodiments of the present disclosure relate to a display device and a manufacturing method thereof.

BACKGROUND

Electrostatic discharge (ESD) tends to do harm to and damage film integrated circuit (FIC) products. For a display device, the driver IC is an important circuit component. In practical applications, due to the requirements of the manufacturing process, a layer of sensitive adhesive (photoresist) is coated on a region of metal terminals of the driver chip. The photoresist prevents the metal terminals from being in contact with the conductor which causes a short circuit. However, as the photoresist is transparent, it is difficult to check its surface smoothness, and further, its anti-ESD effect is not good.

However, at present, the anti-ESD capability of the driver chip has become one of the important factors in measuring the ESD resistance of mobile terminals. For example, specs of anti-ESD for the driver chips anti-ESD in current market is 2 kV or so, but due to the usual technical constraints, the minimum authentication standard for mobile terminals (usually 6~8 kV) cannot be satisfied, resulting in the overall performance of the display products deteriorated.

SUMMARY

At least one embodiments of the present disclosure provides a method for manufacturing a display device, an edge region of a display panel of the display device comprising a first region in which exposed connection line pattern is provided, and a second region in which no connection line pattern is provided; the method comprising:

attaching an electrostatic shielding layer to the edge region, wherein the electrostatic shielding layer comprises an insulating material region and a conductive material region, the insulating material region contacting the first region and the conductive material region contacting the second region.

In one embodiment of the present disclosure, the conductive material region is electrically connected to a conductive contact which is provided in the edge region and grounded.

In one embodiment of the present disclosure, the first region is provided with at least one connection line pattern, attaching an electrostatic shielding layer to the edge region comprises:

attaching an insulating material layer to each of the at least one connection line pattern, respectively; and attaching a conductive material layer to the edge region so as to form the electrostatic shielding layer comprising the insulating material region and the conductive material region.

In one embodiment of the present disclosure, the electrostatic shielding layer comprises an insulating material layer and a conductive material layer which is attached to the insulating material layer in the conductive material region.

In one embodiment of the present disclosure, the conductive material layer is made of a metal foil, and the insulating material layer is made of insulating cloth.

In one embodiment of the present disclosure, a common electrode is formed in the display panel, and the common electrode is located outside the edge region.

At least one embodiment of the present disclosure provides a display device comprising a display panel, an edge region of the display panel comprising a first region in which a connection line pattern is provided and a second region in which no connection line pattern is provided, and an electrostatic shielding layer is attached to the first region; wherein the electrostatic shielding layer comprises an insulating material region and a conductive material region, the insulating material region contacting the first region and the conductive material region contacting the second region.

The insulating material region of the electrostatic shielding layer facing the display panel contacts with a region of the display panel where the connection line pattern is provided, a region of the edge region except the region where the connection line patter is provided contacts with the conductive region of the electrostatic shielding layer.

In one embodiment of the present disclosure, the conductive material region is electrically connected to a conductive contact which is provided in the edge region and grounded.

In one embodiment of the present disclosure, the electrostatic shielding layer comprises at least one insulating material layer and a conductive material layer, wherein each of the at least one insulating material layer is attached to each connection line pattern provided in the first region, and the conductive material layer is attached to the edge region and covers the at least one insulating material layer.

In one embodiment of the present disclosure, the electrostatic shielding layer comprises an insulating material layer and a conductive material layer, the conductive material layer is provided in the conductive material region and attached to the insulating material layer.

In one embodiment of the present disclosure, the conductive material layer is made of a metal foil, and the insulating material layer is made of insulating cloth.

In one embodiment of the present disclosure, the display panel comprises a common electrode, and the common electrode is located outside of the edge region.

BRIEF DESCRIPTION OF THE DRAWINGS

In order to clearly illustrate the technical solutions of the embodiments of the disclosure, the drawings of the embodiments will be briefly described in the following; it is obvious that the drawings described below are only related to some embodiments of the disclosure and thus are not limitative of the disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Figure 1:
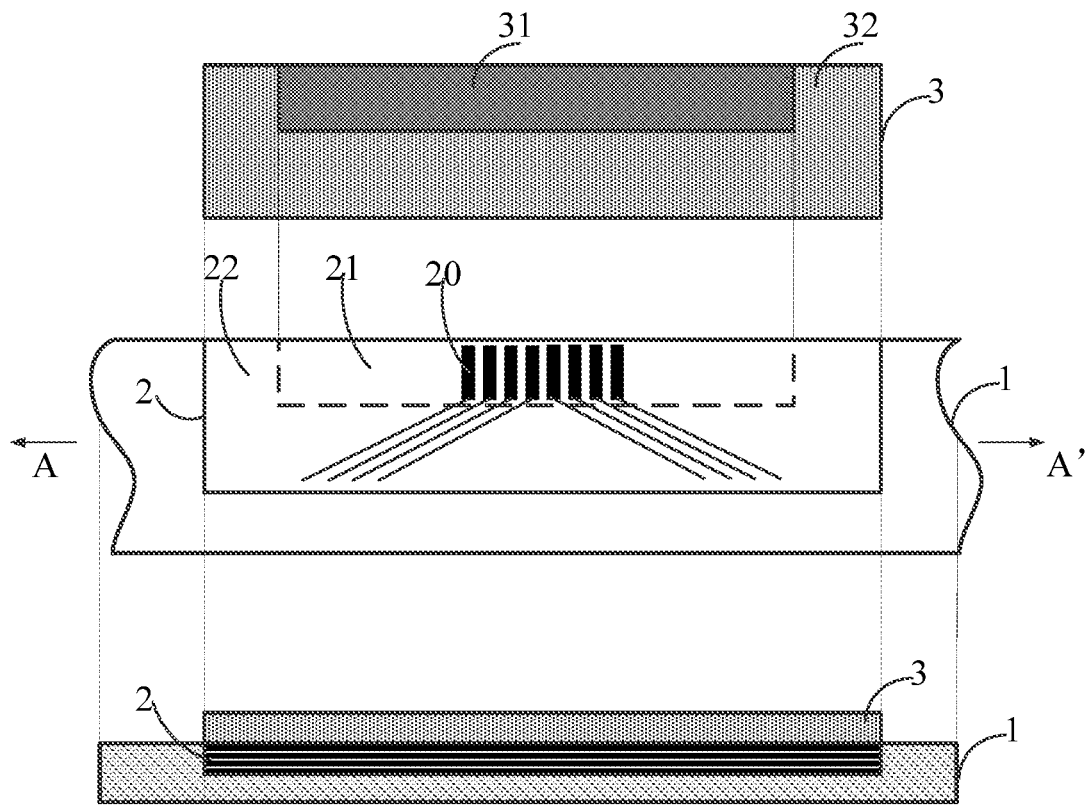
FIG. 1 is a sectional view and a plan view of a display device according to an embodiment of the present disclosure.

At least one embodiment of the present disclosure provides a method for manufacturing a display device, the method comprising attaching an electrostatic shielding layer 3 to the edge region 2 of the display panel 1 exposing a connection line pattern. FIG. 1 illustrates a cross-sectional structure of a display device and a top-view structure according to an embodiment of the present invention. As illustrated in the upper portion of FIG. 1, the edge region 2 of the display panel 1 comprises the first region 21 in which the connection line pattern is provided and the second region 22 in which the connection line pattern is not provided, and the electrostatic shielding layer 3 comprises an insulating material region 31 and a conductive material region 32, wherein the insulating material region 31 faces the display panel 1 and contacts the first region 21, and the conductive material region 32 faces the display panel 1 and contacts the second region 22. In the edge region 2, the boundary between the first region 21 and the second region 22 can be set according to the actual application requirements. The electrostatic shielding layer 3 is attached to the first region 21 of the edge region 2 of the display panel 1, as illustrated in the lower portion of FIG. 1. The lower portion is a cross-sectional view taken along the line A-A' in FIG. 1. The insulating material region 31 is opposed to and in contact with the first region 21, and the conductive material region 32 is opposed to and in contact with the second region 22. For example, the electrostatic shielding layer 3 can cover the edge region 2, and they are fixed to each other by adhesive.

In the embodiment of the present disclosure, by attaching the electrostatic shielding layer 3 to the edge region 2 of the display panel 1 on which the exposed connection line pattern is formed, the influence of the electrostatic charge and the electrostatic field on the connection line pattern formed in the first region 21 can be effectively shielded. Further, the attached electrostatic shielding layer can be used in place of the photoresist formed on the display panel, so that the ESD resistance of the connection line at the edge portion of the chip can be enhanced without increasing process flows with respect to the display panel provided with the photoresist. In addition, with respect to the photoresist, the electrostatic shielding layer, material of which comprises metal, is opaque, and it is easier to check the attachment, and further, defects of surface flatness will not be produced, thereby facilitating enhancing product yield and performance.

It is to be noted that, in the embodiments of the present disclosure, by providing the electrostatic shielding layer 3 on the surface of the edge region 2 of the display panel 1, the electrostatic charge and the electrostatic field that should have reached the surface of the display panel are blocked outside of the display panel. If the ESD discharge phenomenon persists, the electrostatic charge can be stored on the electrostatic shielding layer 3, so that the electrostatic shielding layer 3 becomes a charged body, that is to say, in the case of continuous ESD discharge, the electrostatic shielding layer 3 becomes a charged body and may damage to other parts on the display panel 1.

Figure 2:
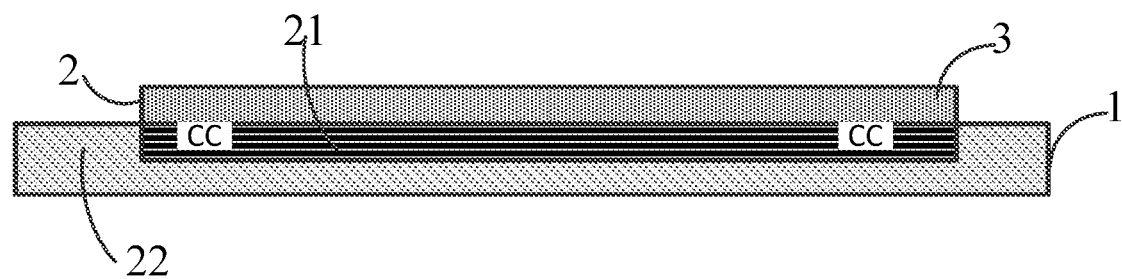
FIG. 2 is a cross-sectional view of the electrostatic shield layer connecting conductive contacts in the display device illustrated in FIG. 1.

As illustrated in FIG. 2, in one embodiment of the present disclosure, the conductive material region 32 can also be in contact with the conductive contact CC (a silver conductive contact illustrated in FIG. 2) grounded and provided in the edge region so as to release the charge on the electrostatic shielding layer 3. By connecting the conductive material region 32 to the conductive contact, the electrostatic charge accumulated on its surface is transferred to the conductive contact CC in time and released, thereby further enhancing the ESD resistance of the display panel.

One of ordinary skills in the art can also provide the grounded conductor connecting structure for the electrostatic shield individually at other locations to release the electrostatic charge in time.

Figure 3:
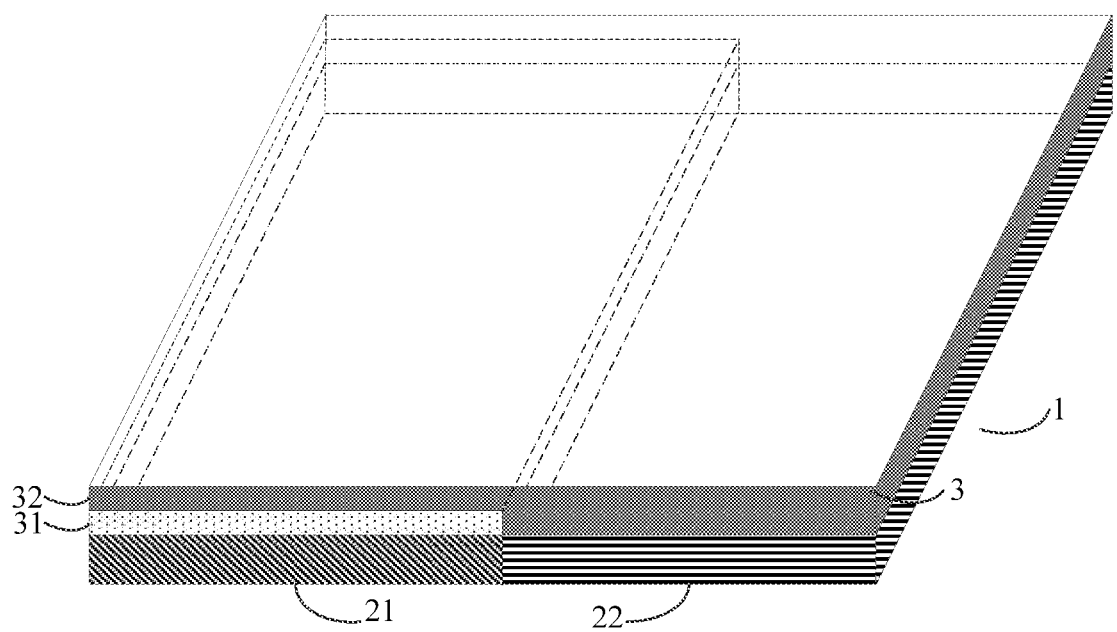
FIG. 3 is an axonometric view of a display device according to another embodiment of the present disclosure.

In embodiments of the present disclosure, in the process of attaching the conductive material region 32 on the surface of the electrostatic shielding layer 3 to the second region 22 of the edge region 2, it is necessary to ensure that the conductive material region 32 cannot contact the connection line pattern. To this end, in one embodiment of the present disclosure, providing at least one connection line pattern in the edge region, and attaching the electrostatic shielding layer 3 to the edge region 2 of the display panel 1 in which the exposed connection line pattern is formed, comprising the following steps:

Attaching one insulating material layer to each of the at least one connection line pattern, respectively;

Attaching one conductive material layer to the edge region 2 so as to form the electrostatic shielding layer 3 comprising the insulating material region 31 and the conductive material region 32, as illustrated in FIG. 3.

In the embodiments of the present disclosure, the electrostatic shielding layer 3 is formed through two steps, and the insulating material layer that is adhered prior to the conductive material layer can cover the exposed surface of the connection line pattern so that the conductive material layer cannot be brought into contact with the connection line pattern, thereby avoiding the conductive material layer being in contact with the connection line to form a short circuit during the process of attaching the conductive material layer, and effectively improving the accuracy of alignment.

Figure 4:
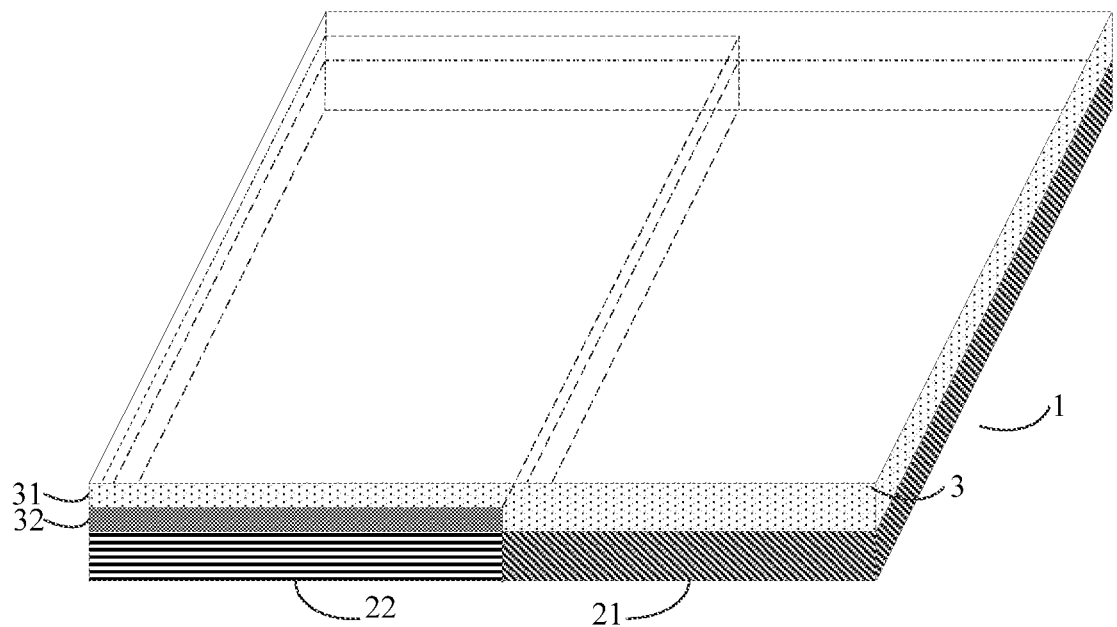
FIG. 4 is an axonometric view of a display device according to still another embodiment of the present disclosure.

FIG. 4 illustrates an arrangement of an electrostatic shielding layer according to another embodiment of the present disclosure. In this embodiment, the electrostatic shielding layer 3 comprises an insulating material layer 31 corresponding to the entire edge region 2 and a conductive material layer 32 attached to the insulating material layer 31 in the conductive material region. In the method according to this embodiment, the conductive material layer 32 is adhered to the conductive material region on the insulating material layer 31 in advance so as to form the electrostatic shielding layer 3, and then the electrostatic shielding layer 3 is adhered to the edge region 2 in a manner of alignment. Based on this, as compared with the attaching method as illustrated in FIG. 3, amount of the conductive material used can be reduced, and the actual amount of the conductive material can be reduced by more than half a, thereby facilitating cost reduction.

It is to be noted that the conductive material layer in the present embodiment can be made of a metal foil. Optionally, the metal foil is made of aluminum; alternatively, the metal foil can be of one layer or of several layers. The insulating material layer is made of insulating cloth.

In one embodiment of the present disclosure, the metal foil and the insulating cloth is adhered to each other by glue so as to simplify the process.

Figure 5:
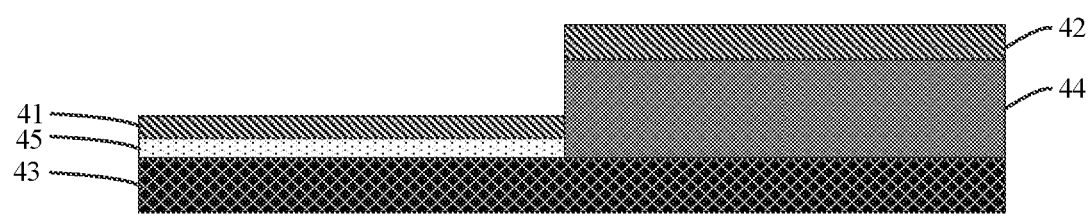
FIG. 5 is a cross-sectional view of an edge region in a display panel according to still another embodiment of the present disclosure.

FIG. 5 is a cross-sectional view of a display panel in an edge region according to a yet another embodiment of the present disclosure. Referring to FIG. 5, in this embodiment, a common electrode layer is formed in the display panel, but the common electrode layer is located outside the edge region, and therefore, is not shown in the edge region portion as illustrated in FIG. 5. In FIG. 5, a source-drain metal layer 45 adjacent to a display region of the display panel and a flatten insulating film layer 44 away from the display region of the display panel are formed on a planarization layer 43 on the substrate of the edge region of the display panel, respectively, a first region having a connection line pattern is formed on the source-drain metal layer 45 as a conductor metal layer 41, for example, a pixel electrode layer; a second region having no connection line pattern is formed on the flatten insulating film layer 44 as an insulating layer 42, such as a passivation layer. After this, the electrostatic shielding layer 3 can be attached thereto. Thus, since the common electrode layer, which is usually formed of ITO (indium tin oxide) material, is removed, the contact resistance at the edge of the display panel due to connecting a pixel electrode layer located overhead can be greatly reduced, and the effect of ESD resistance can be improved.

Based on the same inventive concept, at least one embodiment of the present disclosure provides a display device which can be any product or component with display function, such as a display panel, a mobile phone, a tablet computer, a television set, a laptop computer, a digital photo frame, and the like. As illustrated in FIG. 2, the display device comprises a display panel 1, and an electrostatic shielding layer 3 is attached to the edge region 2 of the display panel 1 in which a connection line pattern is exposed; wherein the edge region 2 of the display panel 1 comprises a first region 21 in which a connection line pattern is provided and a second region 22 in which no connection line pattern is provided, the electrostatic shielding layer 3 comprises an insulating material region 31 and a conductive material region 32, the insulating material region 31 facing the display panel 1 and contacting the first region 21, and the conductive material region 32 facing the display panel 1 and contacting the second region 22.

In the embodiments of the present disclosure, by attaching an electrostatic shielding layer to the edge region of the display panel where a connection line pattern is exposed, the effects of electrostatic charge and electrostatic field on the connection line pattern in the edge region is effectively blocked. In addition, the attached electrostatic shielding layer can replace a photoresist formed on the display panel, thereby increasing the ESD resistance of the display panel without increasing processes with respect to a display panel in which the photoresist is formed on connection lines of chips at the edge. And further, the electrostatic shielding layer made of materials comprising a metal is opaque, which is easier to be checked for attachments than the photoresist and does not produce defects in surface flatness, thereby facilitating improving product yield and performance.

In the display panel according to one embodiment of the present disclosure, the conductive material region can be electrically connected to a conductive contact provided in the edge region and grounded so as to further enhance the ESD resistance of the display panel.

In the display panel according to an embodiment of the present disclosure, at least one connection line pattern is provided in the first region, the electrostatic shielding layer comprises at least one insulating material layer and a conductive material layer, wherein the insulating material layer is attached to each of the at least one connecting line pattern; the conductive material layer is attached to the edge region and covers the at least one insulating material layer. Based on this, it is possible to avoid short-circuiting the connection ling pattern during the process of attaching the conductive material layer, thereby effectively improving the accuracy of alignment.

In the display panel according to an embodiment of the present disclosure, the electrostatic shielding layer comprises an insulating material layer and a conductive material layer attached to the insulating material layer in the region of the conductive material region. Thus, it is possible to reduce the amount of the conductive material used, thereby facilitating cost down.

In the display panel according to one embodiment of the present disclosure, the conductive material layer is made of a metal foil; optionally, the metal foil is made of aluminum; and optionally, the metal foil can be of one layer or of several layers. The insulating material layer is made of insulating cloth.

In the display panel according to one embodiment of the present disclosure, the metal foil and the insulating cloth is adhered to each other by glue so as to simplify the process.

In the display panel according to one embodiment of the present disclosure, the display panel has a common electrode layer; and the common electrode layer is located outside the edge region. Thus, the contact resistance due to connecting the pixel electrode layer located overhead at the edge of the display panel can be greatly reduced, and the effect of the ESD resistance can be improved.

In the embodiments of the present disclosure, numerous specific details are set forth. It will be understood, however, that the embodiments of the present disclosure may be implemented without these specific details. In some embodiments, well-known methods, structures, and techniques are not illustrated in detail so as not to obscure the understanding of the present disclosure.

It is to be noted that, in the embodiments of the present disclosure, the azimuth or positional relationship indicated by the terms "up", "down" and the like is based on the azimuth or positional relationship shown in the drawings only for ease of description of the present disclosure and simplifying description, rather than indicating or implying that the device or element referred to must have a specific orientation, constructed and operated in a particular orientation and therefore can not be construed as a limit to the disclosure. The terms "mount", "connecting", "connected" should be broadly understood, for example, may be a fixed connection, a detachable connection, or an integral connection, or may be a mechanical connection, or an electrical connection, can be directly connected, or indirectly connected through an intermediate medium, can be internal connection of two components. It will be apparent to one of ordinary skills in the art that the specific meaning of the above terms in the present disclosure can be understood according to actual application scenarios.

It is also to be noted that, in the present disclosure, relational terms such as first and second terms are used only to distinguish one entity or operation from another entity or operation without necessarily requiring or implying that there is any such physical relationship or sequence between these entities or operations. Moreover, the term "comprising" or "including" or any other variant thereof is intended to encompass a non-exclusive inclusion, such that the process, method, article, or device that includes a series of elements includes not only those elements but also those that are not explicitly listed or other elements that are inherent to such processes, methods, articles, or equipment. In the absence of more limitations, the elements defined by the statement "including a . . . " do not exclude the existence of additional identical elements in the process, method, article or device that includes the elements.

The foregoing are merely exemplary embodiments of the disclosure, but are not used to limit the protection scope of the disclosure. The protection scope of the disclosure shall be defined by the attached claims.

The present disclosure claims priority of Chinese Patent Application No. 201610331525.2 filed on May 18, 2016, the disclosure of which is hereby entirely incorporated by reference.

The invention claimed is:

1. A method for manufacturing a display device, an edge region of a display panel of the display device comprising a first region in which an exposed connection line pattern is provided, and a second region in which no connection line pattern is provided; the method comprising:
    attaching an electrostatic shielding layer to the edge region, wherein the electrostatic shielding layer comprises an insulating material region and a conductive material region, the insulating material region contacting the first region and the conductive material region contacting the second region,
    wherein the first region is provided with at least one connection line pattern, and attaching an electrostatic shielding layer to the edge region comprises:
    attaching an insulating material layer to each of the at least one connection line pattern, respectively; and
    attaching a conductive material layer to the edge region so as to form an electrostatic shielding layer comprising the insulating material region and the conductive material region.

2. The method according to claim 1, wherein the conductive material region is electrically connected to a conductive contact which is provided in the edge region and grounded.

3. The method according to claim 2, wherein the first region is provided with at least one connection line pattern, and attaching an electrostatic shielding layer to the edge region comprises:
    attaching an insulating material layer to each of the at least one connection line pattern, respectively; and
    attaching a conductive material layer to the edge region so as to form an electrostatic shielding layer comprising the insulating material region and the conductive material region.

4. The method according to claim 2, wherein the electrostatic shielding layer comprises an insulating material layer and a conductive material layer which is attached to the insulating material layer in the conductive material region.

5. The method according to claim 2, wherein a common electrode is formed in the display panel, and the common electrode is located outside the edge region.

6. The method according to claim 1, wherein the electrostatic shielding layer comprises an insulating material layer and a conductive material layer which is attached to the insulating material layer in the conductive material region.

7. The method according to claim 6, wherein the conductive material layer is made of a metal foil, and the insulating material layer is made of insulating cloth.

8. The method according to claim 6, wherein a common electrode is formed in the display panel, and the common electrode is located outside the edge region.

9. The method according to claim 1, wherein the conductive material layer is made of a metal foil, and the insulating material layer is made of insulating cloth.

10. The method according to claim 9, wherein a common electrode is formed in the display panel, and the common electrode is located outside the edge region.

11. The method according to claim 1, wherein a common electrode is formed in the display panel, and the common electrode is located outside the edge region.

12. A display device comprising a display panel, an edge region of the display panel comprising a first region in which a connection line pattern is provided and a second region in which no connection line pattern is provided, and an electrostatic shielding layer is attached to the first region; wherein the electrostatic shielding layer comprises an insulating material region and a conductive material region, the insulating material region contacting the first region and the conductive material region contacting the second region,
    wherein the electrostatic shielding layer comprises at least one insulating material layer and a conductive material layer, wherein each of the at least one insulating material layer is attached to each connection line pattern provided in the first region, and the conductive material layer is attached to the edge region and covers the at least one insulating material layer.

13. The display device according to claim 12, wherein the conductive material region is electrically connected to a conductive contact which is provided in the edge region and grounded.

14. The display device according to claim 13, wherein the electrostatic shielding layer comprises at least one insulating material layer and a conductive material layer, wherein each of the at least one insulating material layer is attached to each connection line pattern provided in the first region, and the conductive material layer is attached to the edge region and covers the at least one insulating material layer.

15. The display device according to claim 12, wherein the electrostatic shielding layer comprises an insulating material layer and a conductive material layer, the conductive material layer is provided in the conductive material region and attached to the insulating material layer.

16. The display device according to claim 12, wherein the conductive material layer is made of a metal foil, and the insulating material layer is made of insulating cloth.

17. The display device according to claim 12, wherein the display panel comprises a common electrode, and the common electrode is located outside of the edge region.

* * * * *